US007177781B2

(12) United States Patent
Strang et al.

(10) Patent No.: US 7,177,781 B2
(45) Date of Patent: Feb. 13, 2007

(54) METHOD AND SYSTEM FOR ELECTRON DENSITY MEASUREMENT

(75) Inventors: Eric J. Strang, Chandler, AZ (US); Richard Parsons, Mesa, AZ (US); Jody Goldfield, Scottsdale, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/521,118

(22) PCT Filed: Jul. 23, 2003

(86) PCT No.: PCT/US03/19872

§ 371 (c)(1), (2), (4) Date: Jan. 12, 2005

(87) PCT Pub. No.: WO2004/010151

PCT Pub. Date: Jan. 29, 2004

(65) Prior Publication Data

US 2006/0032287 A1 Feb. 16, 2006

Related U.S. Application Data

(60) Provisional application No. 60/397,661, filed on Jul. 23, 2002.

(51) Int. Cl.
*G06F 11/30* (2006.01)

(52) U.S. Cl. .................................... 702/183; 702/188

(58) Field of Classification Search .................. 702/57, 702/64, 65, 67, 68, 107; 324/464, 633, 636, 324/76.76, 76.39; 438/5, 8, 9, 10
See application file for complete search history.

(56) References Cited

U.S. PATENT DOCUMENTS 5,936,481 A * 8/1999 Fujii ......................... 333/17.3
6,133,795 A * 10/2000 Williams ....................... 331/9
6,766,279 B2 * 7/2004 Linley et al. ............... 702/188
2004/0267547 A1 * 12/2004 Strang .......................... 705/1

FOREIGN PATENT DOCUMENTS

JP 03263828 A * 11/1991
WO WO 200106402 A1 * 1/2001
WO WO 200106544 A2 * 1/2001
WO WO 200137306 A1 * 5/2001

* cited by examiner

*Primary Examiner*—Carol S. W. Tsai
*Assistant Examiner*—Manuel Barbee
(74) *Attorney, Agent, or Firm*—Oblon, Spivak, McClelland, Maier & Neustadt, P.C.

(57) ABSTRACT

The present invention provides a diagnostic system for plasma processing, wherein the diagnostic system comprises a multi-modal resonator, a power source, a detector, and a controller. The controller is coupled to the power source and the detector and it is configured to provide a man-machine interface for performing several monitoring and controlling functions associated with the diagnostic system including: a Gunn diode voltage monitor, a Gunn diode current monitor, a varactor diode voltage monitor, a detector voltage monitor, a varactor voltage control, a varactor voltage sweep control, a resonance lock-on control, a graphical user control, and an electron density monitor. The diagnostic system can further provide a remote controller coupled to the controller and configured to provide a remote man-machine interface. The remote man-machine interface. The remote man-machine interface can provide a graphical user interface in order to permit remote control of the diagnostic system by an operator. In addition, the present invention provides several methods of controlling the diagnostic system in order to perform both monitor and control functions.

42 Claims, 14 Drawing Sheets

METHOD AND SYSTEM FOR ELECTRON DENSITY MEASUREMENT

CROSS-REFERENCE TO RELATED APPLICATIONS

This application is related to co-pending International Application No. PCT/US00/19539, Publication No. WO 01/06402, published on Jan. 25, 2001; International Application No. PCT/US00/19536, Publication No. WO 01/06544, published on Jan. 25, 2001; International Application No. PCT/US00/19535, Publication No. WO 01/06268, published on Jan. 25, 2001; International Application No. PCT/US00/19540, filed on Jul. 20, 2001; pending Application Ser. No. 60/330,518, entitled "Method and apparatus for wall film monitoring", filed on Oct. 24, 2001; pending application Ser. No. 60/330,555, entitled "Method and apparatus for electron density measurement", filed on Oct. 24, 2001; pending application 60/352,502, entitled "Method and apparatus for electron density measurement and verifying process status," filed on Jan. 31, 2002; pending application 60/352,546, entitled "Method and apparatus for determination and control of plasma state," filed on Jan. 31, 2002; pending application 60/352,504, entitled "Method and apparatus for monitoring and verifying equipment status," filed on Jan. 31, 2002; pending application 60/352,503, entitled "Apparatus and method for improving microwave coupling to a resonant cavity," filed on Jan. 31, 2002; and now abandoned application 60/397,661, entitled "Method and system for electron density measurement," filed Jul. 23, 2002, which the present application claims priority to. The contents of these applications are incorporated herein by reference.

FIELD OF THE INVENTION

The present invention relates to plasma processing and more particularly to a diagnostic system for plasma processing comprising a man-machine interface (MMI) and a remote MMI.

BACKGROUND OF THE INVENTION

The fabrication of integrated circuits (IC) in the semiconductor industry typically employs plasma to create and assist surface chemistry within a plasma processing chamber necessary to remove material from and deposit material to a substrate. In general, plasma is formed within the processing chamber under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate).

The semiconductor industry is constantly striving to produce smaller ICs and to increase the yield of viable ICs. Accordingly, the material processing equipment used to process the ICs have been required to meet increasingly more stringent performance requirements for etching and deposition processes (e.g., rate, selectivity, critical dimension, etc.).

In order to meet the aforementioned challenges, plasma processing systems are equipped with a variety of diagnostic systems in order to provide comprehensive data necessary to tightly control a process. However, the diagnostic system employed in semiconductor manufacturing can be complex and, in general, can require experienced personnel to operate. Therefore, it is necessary to provide a user interface that simplifies and/or automates the use of such diagnostics systems.

SUMMARY OF THE INVENTION

The present invention relates to a method and system for monitoring electron density during plasma processing. The present invention advantageously provides a method and system that enables semiconductor manufacturers to satisfy more stringent performance requirements for material processing equipment used in the semiconductor industry.

The present invention provides a diagnostic system for plasma processing, the diagnostic system comprising: a multi-modal resonator; a power source coupled to the multi-modal resonator; a detector coupled to the multi-modal resonator; and a controller coupled to the power source and the detector, wherein the controller provides at least one function, the at least one function including a Gunn diode voltage monitor, a Gunn diode current monitor, a varactor voltage monitor, a detector voltage monitor, a varactor voltage control, a varactor voltage sweep control, a resonance lock-on control, a graphical user control, and an electron density monitor.

It is an object of the present invention that the controller further provides a man-machine interface for performing the at least one function.

It is an object of the present invention that the controller further provides a graphical user interface for performing the at least one function.

The present invention further provides a method of controlling the diagnostic system, the method comprising the steps of: activating the controller; selecting a varactor voltage control in order to control a varactor voltage of the power source; selecting a detector voltage monitor in order to monitor a voltage from the detector; and adjusting the varactor voltage for the power source using said controller.

The present invention further provides another method of controlling the diagnostic system, the method comprising the steps of: activating the controller; selecting a varactor voltage sweep control in order to automatically control a varactor voltage of the power source; coupling the varactor voltage to a display; and coupling the transmission signal from the detector to the display.

The present invention further provides another method of controlling the diagnostic system, the method comprising the steps of: activating the controller; selecting a resonance lock-on control; setting a varactor voltage set point for a varactor voltage of the power source; and locking the output frequency of the power source to the cavity resonance of the multi-modal resonator by activating the varactor voltage set-point using the controller.

In an embodiment of the present invention, the diagnostic system further provides a remote controller coupled to the controller, the remote controller provides a remote man-machine interface for performing the at least one function.

The present invention further provides a method of remotely controlling the diagnostic system using the remote man-machine interface, the method comprising the steps of: activating the controller; activating the remote man-machine interface; selecting a varactor voltage sweep control; and activating the varactor voltage sweep control using default settings.

It is a further object of the present invention to modify the default settings prior to activating the varactor voltage sweep control.

The present invention further provides another method of remotely controlling the diagnostic system using the remote man-machine interface, the method comprising the steps of: activating the controller; activating the remote man-machine interface; selecting a resonance lock-on control; and activating the resonance lock-on control using default settings.

It is a further object of the present invention to modify the default settings prior to activating the resonance lock-on function.

BRIEF DESCRIPTION OF THE DRAWINGS

These and other advantages of the invention will become more apparent and more readily appreciated from the following detailed description of the exemplary embodiments of the invention taken in conjunction with the accompanying drawings, where.

DETAILED DESCRIPTION OF AN EMBODIMENT

The present invention generally relates to fabrication of integrated circuits in the semiconductor industry. The present invention advantageously provides a method and apparatus that enables semiconductor manufacturers to satisfy more stringent performance requirements for material processing equipment used in the semiconductor industry.

A method of improving the performance of material processing equipment is to monitor and control plasma electron density within the processing chamber during the manufacturing process. Ideally, the plasma electron density is maintained such that the processes being performed are uniformly acting upon the entire surface of the substrate upon which a process is being performed.

An exemplary device used to measure plasma electron density is a microwave system of suitably high frequency to exceed the electron plasma frequency. The device includes a pair of mirrors immersed in the plasma. Microwave power is coupled to a first microwave port on the first mirror and a detector is utilized to monitor the transmission of microwave power through the resonant cavity formed by the opposing mirrors. The detector is either coupled to a second port on the first mirror or a second port on the second mirror. For a Gaussian beam, cavity transmission occurs at discrete frequencies. The discrete frequencies correspond to an integer number of half wavelengths between the apex of each mirror, as expressed by the following equation:

$$\nu_{m,n,q} = \nu_{0,0,q} = \frac{c}{2nd}\left(q + \frac{1}{2}\right), \tag{1}$$

where $\nu_{0,0,q}$ is a resonant frequency of mode order q (assuming only longitudinal modes, i.e. m=n=0), c is the speed of light in a vacuum, n is the index of refraction for the medium bounded by the mirrors and d is the mirror spacing (apex-to-apex). For a vacuum, n=1, however, the presence of plasma or, more specifically, a population of free electrons leads to a reduction of the index of refraction or an observable increase (shift) of the cavity resonance frequencies $\nu_{0,0,q}$. For a given mode q, the shift in frequency can be related to the index of refraction n and, thereafter, the (integrated) electron density $\langle n_e \rangle$, is expressed by the following equation:

$$\langle n_e \rangle \cong \frac{8\pi^2 \varepsilon_o}{e^2} \nu_o \Delta\nu, \tag{2}$$

for $\nu_o >> \omega_{pe}/2\pi$. For further details, the use of the above system to measure plasma electron density is described in International App. No. PCT/US00/19539 (based upon U.S. Ser. No. 60/144,880), International App. No. PCT/US00/19536 (based upon U.S. Ser. No. 60/144,883), International App. No. PCT/US00/19535 (based upon U.S. Ser. No. 60/144,878), and International App. No. PCT/US00/19540 (based upon U.S. Ser. No. 60/166,418), each of which is incorporated herein by reference in their entirety.

Figure 1:
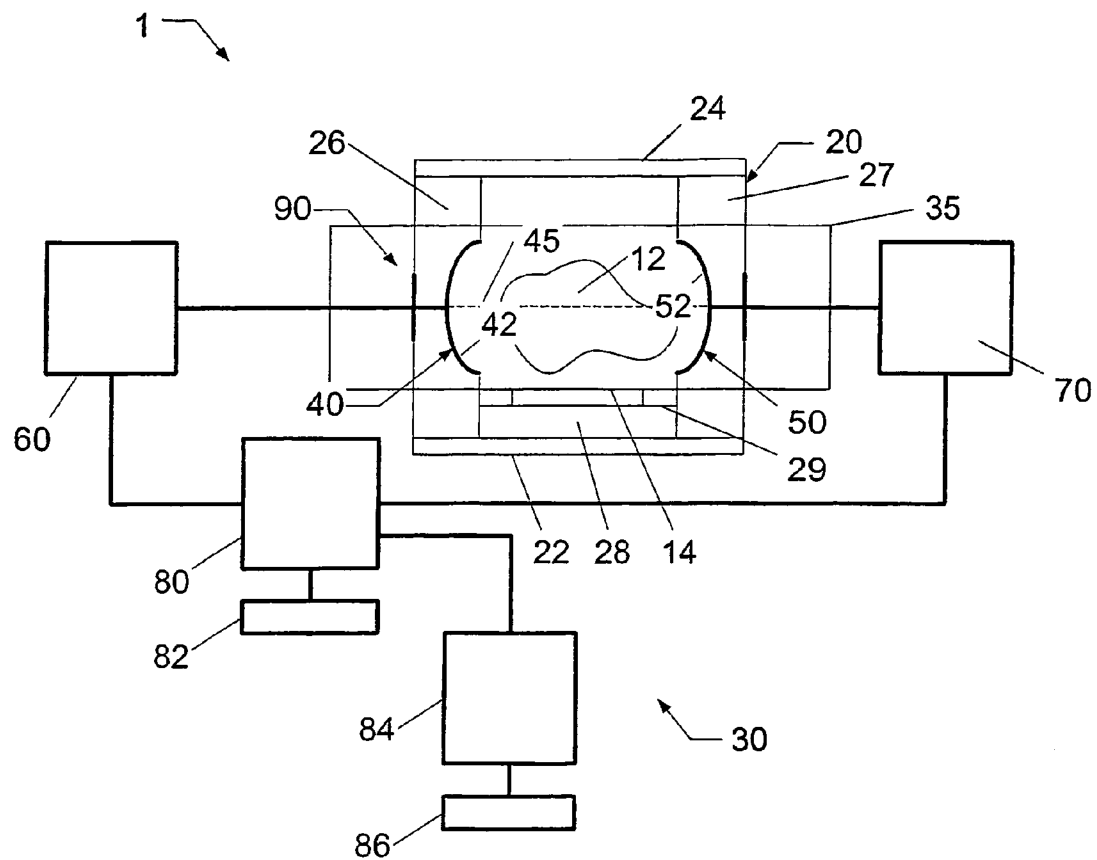
FIG. 1 shows a simplified block diagram of a diagnostic system according to an embodiment of the present invention.

An embodiment of the plasma processing system 1 according to the present invention is depicted in FIG. 1. The plasma processing system 1 includes a plasma chamber 20 and a diagnostic system 30 for use in plasma chamber 20. Diagnostic system 30 generally includes at least one multi-modal resonator 35, power source 60, detector 70, and controller 80. Controller 80 can, for example, include a computer or digital signal processor. Additionally, diagnostic system 30 can comprise a man-machine interface (MMI) 82 coupled to the controller 80, a remote controller 84 coupled to controller 80, and a remote MMI 86 coupled to the remote controller 84. Remote controller 84 can, for example, be a computer or digital signal processor. Desirably, multi-modal resonator 35 comprises an open resonant cavity having at least one reflecting surface, and reflecting surfaces can have planar and/or non-planar geometries. In a preferred embodiment, the reflecting surfaces are provided within plasma chamber 20. Alternatively, at least one reflecting surface can be provided outside plasma chamber 20.

The plasma chamber 20 generally includes a base wall 22, an upper wall 24, and side walls including a first side wall 26 and a second side wall 27. The plasma chamber 20 also includes a substrate holder (or chuck assembly) 28 having a wafer plane 29, such as an upper surface of the substrate holder 28 upon which a substrate 14 is positioned in order to be processed within the plasma chamber 20.

In a preferred embodiment, multi-modal resonator 35 comprises first microwave mirror 40 coupled to power source 60 through a microwave window assembly 90, and second microwave mirror 50 coupled to detector 70 through another microwave window assembly 90. Multi-modal resonator extends along an axis generally parallel to a wafer plane of substrate holder 28 within plasma chamber 20.

In a preferred embodiment, the first microwave mirror 40 has a concave surface 42 and is provided within the plasma chamber 20. The second microwave mirror 50 has a concave surface 52 and is also provided within the plasma chamber 20. Alternately, the mirror surfaces can have flat and/or convex surfaces.

In the embodiment depicted in FIG. 1, the first mirror 40 is integrated within side wall 26 of the plasma chamber 20 and the second mirror 50 is integrated within side wall 27 of the plasma chamber 20. The concave surface 52 of the second microwave mirror 50 is oriented opposite the concave surface 42 of the first microwave mirror 40. This geometry can be referred to as a confocal geometry when the spacing between the mirrors equals the radius of curvature of the mirrors. In an alternate embodiment, the mirrors are arranged in a semi-confocal configuration wherein a first mirror (comprising a concave surface of radius of curvature R) is located a distance d=R from a second mirror comprising a flat surface. In an alternate embodiment, the spacing d is adjusted to be different than the radius of curvature of both mirrors in the confocal arrangement or the radius of curvature of the first mirror in the semi-confocal arrangement. In an alternate embodiment, the radius of curvature for each mirror is arbitrary. The selection of the spacing and respective mirror radii of curvature is well known to those skilled in the art of designing resonant cavities.

The power source 60 is coupled to a microwave window assembly 90 that comprises a first microwave mirror 40 and is configured to produce a microwave signal. Desirably, the microwave signals within multi-modal resonator 35 extend along an axis 45 generally parallel to a wafer plane 29 of a substrate holder 28. However, it is possible that the microwave signals within multi-modal resonator 35 do not extend in a direction generally parallel to a wafer plane 29 of substrate holder 28. Controller 80 is coupled to power source 60 and is adapted to change at least one of: an output frequency, an output power, an output phase, and an operating state of power source 60. For example, controller 80 can cause power source 60 to change its operational state at various times before, during, and after a plasma has been established in plasma chamber 20.

Controller 80 is also coupled to detector 70. Desirably, detector 70 is configured to measure at least one transmitted microwave signal and provide transmitted signal measurement data, and detector 70 is configured to measure at least one reflected microwave signal and provide reflected signal measurement data. Alternately, detector 70 is configured to measure at least one transmitted microwave signal and provide transmitted signal measurement data, or detector 70 is configured to measure at least one reflected microwave signal and provide reflected signal measurement data.

In the embodiment depicted in FIG. 1, the microwave mirrors 40 and 50 can be immersed within the process region 12 such that the concave surfaces 42 and 52, respectively, oppose one another. Microwave power is input from the power source 60 to the first mirror 40 via a microwave window assembly, and the detector 70 is configured to monitor cavity transmission by being coupled to the opposite second mirror 50 using a second microwave window assembly 90. The detector 70 can be coupled to either the mirror opposite to the mirror to which microwave power is input, as is the case in FIG. 1, or the detector can be coupled to the same mirror to which microwave power is input (i.e. the first mirror 40 in FIG. 1), or detectors can be coupled to both mirrors. As will be discussed in further detail below, microwave windows are inserted between the microwave input and the detector, and the respective mirror(s) to which the microwave input and the detector are connected, in order to preserve the integrity of the vacuum within the plasma processing chamber 20.

Figure 2:
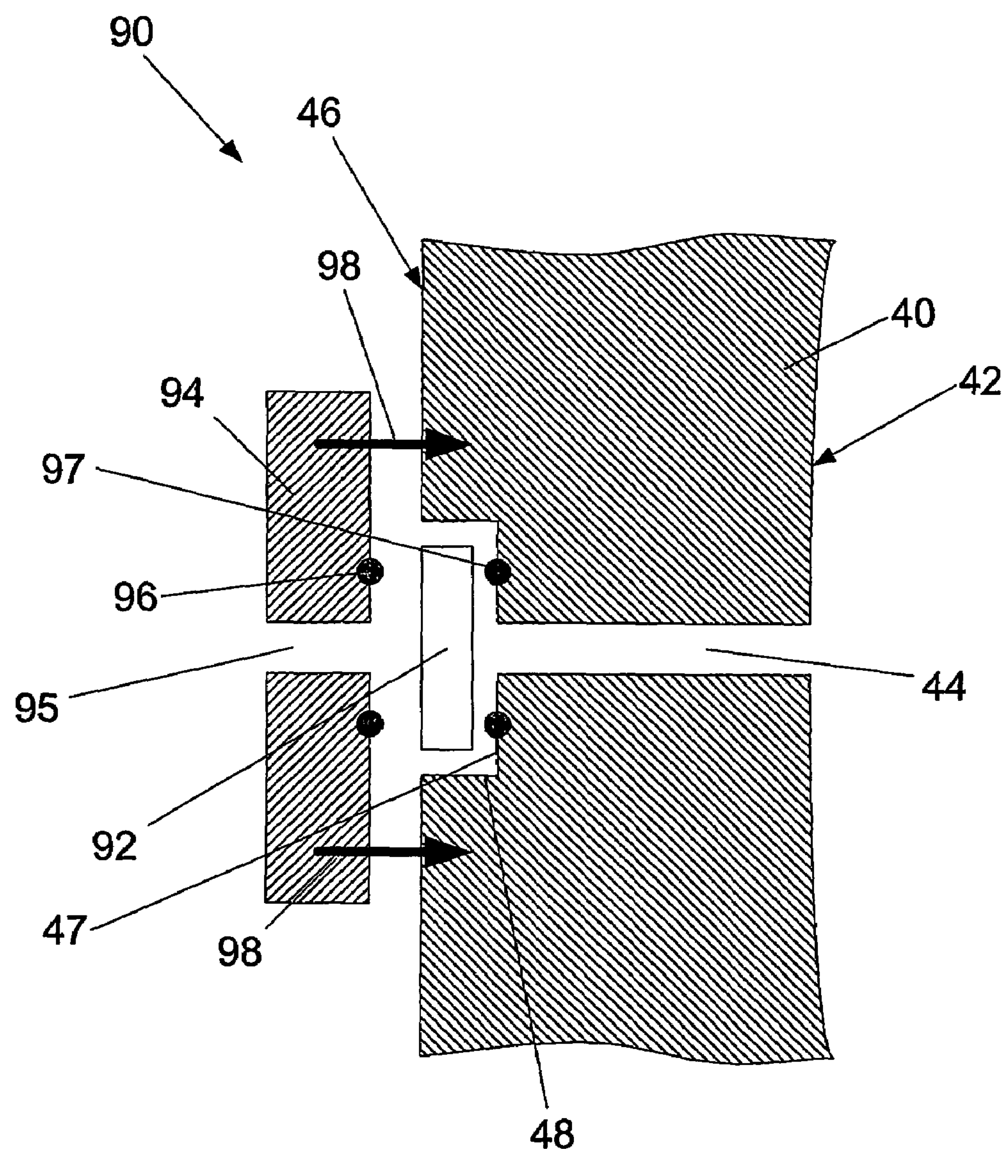
FIG. 2 shows an enlarged, exploded, cross-sectional view of a microwave mirror having an aperture, a microwave window and associated mounting structure according to an embodiment of the present invention.

FIG. 2 depicts a detailed schematic of a microwave window assembly 90 for the first mirror 40. For example, a microwave window assembly can be used to provide a coupling from the power source 60 through an aperture 44 in chamber wall 26 to the first mirror 40. A window assembly 90 having substantially the same structure can be provided for the second mirror 50, which is used to provide a coupling to the detector 70 through an aperture 54 in chamber wall 27 from the second mirror 50.

The microwave window assembly 90 depicted in FIG. 2 includes a microwave window 92 that is mounted between a window flange 94 and a recessed surface 47 of the first mirror 40. In the embodiment depicted in FIG. 2, the window 92 is provided within a recessed portion 48 on the rear surface 46 of the first mirror 40. The microwave window 92 is provided between a first O-ring 96 provided on the window flange 94 and a second O-ring 97 provided on the recessed surface 47 of the first mirror 40. A plurality of fasteners 98 are provided to mechanically connect the window flange 94 to the first mirror 40 such that the microwave window 92 is securely mounted within the recessed portion 48 on the rear surface 46 of the first mirror 40. The window 92 is centered on a waveguide aperture 95 extending through the window flange 94 and the waveguide aperture 44 extending through the first mirror 40. The rectangular waveguide apertures 44 and 95 are sized for a specific microwave band of operation and are fabricated using EDM. In an alternate embodiment, the rectangular waveguide aperture 44 comprises a rectangular cross-section with varying vertical and/or lateral dimensions. For example, waveguide aperture 44 can comprise a microwave horn such as a pyramidal horn, an E-plane horn, or an H-plane horn. Details regarding the design and implementation of a microwave horn is described in pending U.S. patent Ser. No. 60/352,503 (filed on Jan. 31, 2002), incorporated herein by reference. In an alternate embodiment, waveguide apertures 44 and 95 are non-rectangular (e.g. circular). In general, processing material will form on the vacuum or process side of the window 92, however, the processing material will form at a rate different than it will form on the mirror surface exposed to the plasma. The microwave window 92 is fabricated from a dielectric material such as alumina (sapphire), aluminum nitride, quartz, polytetrafluoroethylene (PTFE/Teflon), or Kapton. The window 92 is preferably fabricated from sapphire due to its compatibility with the oxide etch processes.

The mirrors 40 and 50 are preferably fabricated from aluminum. In alternative embodiments, the mirrors 40 and 50 are anodized with preferably a 10 to 50 micron thick anodization or coated with a material such as Yttria ($Y_2O_3$), aluminum oxide ($Al_2O_3$), or a combination of the two materials.

The microwave power source 60 is preferably an electronically tunable source. For example, microwave power source 60 can be a voltage controlled Gunn diode oscillator (VCO). When the varactor diode of the VCO is biased with a direct current voltage, the output frequency of the VCO can be varied over some spectral range. Therefore, the VCO specifications generally include center frequency, bandwidth and minimum output power. For example, at 35 GHz, a commercially available VCO is a WBV-28-20160RI Gunn diode oscillator offered by Millitech, LLC (20 Industrial Drive East, South Deerfield, Mass. 01373-0109). The specifications for this VCO include a center frequency of 35 GHz with plus or minus 1 GHz bandwidth and a minimum output power of 40 mW. The bias tuning range can generally extend from +25 V to −25 V, thereby adjusting this bias voltage leads to a change in the output frequency of the VCO. In alternative embodiments, operation at higher frequencies, such as 70 GHz and 105 GHZ, can be achieved using a frequency doubler (MUD-15-16F00) or tripler (MUT-10-16F00) with the above mentioned VCO. Using the above configuration, a center frequency of 70 GHz with plus or minus 2 GHz bandwidth and a minimum output power of 0.4 to 0.9 mW and a center frequency of 105 GHz with plus or minus 3 GHz bandwidth and a minimum output power of 0.4 to 0.7 mW can be achieved, respectively. In a preferred embodiment, a 94 GHz VCO (Model GV-10) is used and is commercially available from Farran Technology LTD (Ballincollig, Cork, Ireland). The Model GV-10 VCO has a center frequency of 94 GHz with plus or minus 750 MHz bandwidth, a minimum output power of 10 mW, and a varactor tuning range of −0 to −25 V.

The detector 70 is preferably a general purpose diode detector such as those commercially available from Millitech, LLC. For example, a DXP-15-RNFW0 and a DXP-10-RNFW0 are general purpose detectors in the V-band (50 to 75 GHz) and W-band (75 to 110 GHz), respectively.

Referring again to FIG. 1, controller 80 is coupled to power source 60 and detector 70, and provides one or more functions for operating power source 60, detector 70, and multi-modal resonator 35. Controller 80 can provide monitoring functions such as a Gunn diode voltage monitor, a Gunn diode current monitor, a varactor voltage monitor, a detector voltage monitor, and an electron density monitor. Furthermore, controller 80 can provide controlling functions including at least one of a varactor voltage control, a varactor voltage sweep control, a resonance lock-on control, and a graphical user control.

Figure 3:
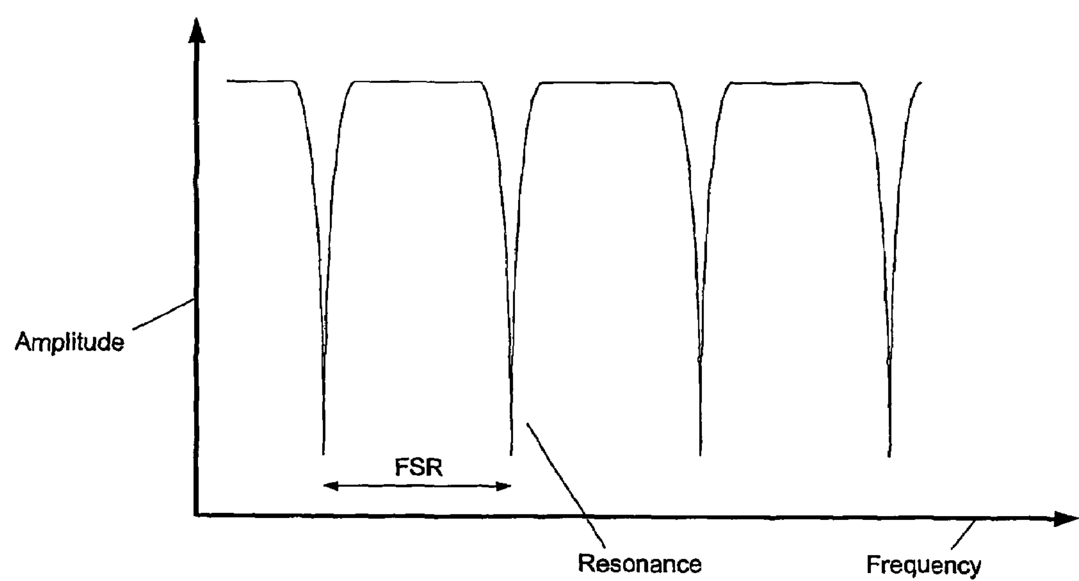
FIG. 3 is a graphical representation of an exemplary cavity transmission spectrum showing several longitudinal resonances and a respective free spectral range.

As discussed earlier with reference to equation (1), transmission through multi-modal resonator 35 occurs at discrete frequencies and, more specifically, at discrete frequencies where longitudinal resonance exists. For example, when using a power source 60 comprising a voltage controlled oscillator (VCO), the frequency of microwave energy coupled to multi-modal resonator 35 can be varied, across the bandwidth of the VCO, by adjusting the bias voltage on the varactor diode. Therefore, adjusting the varactor bias voltage and, hence, the VCO frequency, and monitoring the signal output from detector 70, the transmission spectrum can be observed as shown in FIG. 3. FIG. 3 illustrates a typical transmission spectrum observed using a negative polarity detector, indicating the longitudinal resonances in frequency space and the spacing of the resonances or the free spectral range (FSR). In an embodiment, controller 80 provides a varactor voltage control permitting an operator to manually adjust the varactor voltage and, for example, monitor the detector output using an internal or external oscilloscope or a computer, each of which is capable of presenting data via a display. In another alternate embodiment, controller 80 provides a varactor voltage sweep control permitting an automatic sweep of the varactor voltage using an internally located waveform generator. Similarly, for example, the detector output can be monitored using an internal or external oscilloscope or a computer, each of which is capable of presenting data via a display. Both functions are discussed in greater detail below.

In another embodiment of the present invention, controller 80 provides a resonance lock-on control that includes a lock-on circuit coupled to the power source 60 and the detector 70. The lock-on circuit can be utilized to lock the output frequency of the power source 60 to a cavity resonance. The lock-on circuit superposes a dither signal (e.g. 1 kHz, 10 mV amplitude square wave) on a direct current voltage substantially near the voltage and related output VCO frequency that corresponds with a pre-selected longitudinal frequency in multi-modal resonator 35 (i.e. the output frequency of the VCO falls within the “envelope” of the selected cavity longitudinal resonance). The transmission signal detected by detector 70 is provided to the lock-on circuit, where it can represent a first derivative of the cavity transmission function (transmitted power versus frequency). The signal input to the lock-on circuit from detector 70 provides an error signal by which the direct current component of the VCO bias voltage is adjusted to drive the VCO output frequency to the frequency associated with the peak of a pre-selected longitudinal resonance as shown in FIG. 3. FIG. 3 presents an exemplary cavity transmission spectrum (from a negative polarity detector) indicating several longitudinal resonances and the respective free spectral range (FSR).

As described above, the introduction of plasma within the multi-modal resonator 35 causes a shift in frequency for each of the resonances shown in FIG. 3 (i.e. each of the resonances shift to the right in FIG. 3 when the electron density is increased or the index of refraction is decreased according to equation (1)). Therefore, once the output frequency of the VCO is locked to a selected cavity resonance, the direct current bias voltage with and without plasma can be recorded and the frequency shift of the selected resonance is determined from the voltage difference and the respective VCO calibration. For example, in substrate processing, the direct current bias voltage is recorded once a new substrate is received by the process tool for materials processing and prior to the ignition of plasma. Hereinafter, this measurement will be referred to as the vacuum resonance voltage. Once the plasma is formed, the direct current bias voltage is obtained as a function of time for the given substrate and the time varying voltage difference or ultimately electron density (via equation (2)) is recorded.

In another embodiment of the present invention, controller 80 provides a graphical user control that can be either locally located relative to plasma processing system 1 or remotely located relative to plasma processing system 1. For example, the graphical user control can permit an operator to either locally or remotely perform the above described controlling functions using a graphical user interface (GUI).

Figure 4:
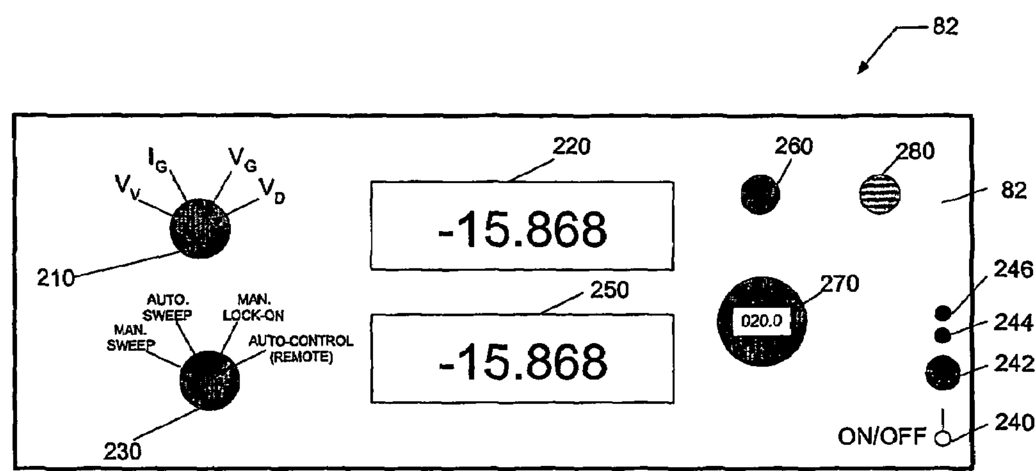
FIG. 4 shows a man-machine interface (MMI) for a diagnostic controller according to an embodiment of the present invention.

Each of the above identified monitoring and controlling functions are now discussed in greater detail. FIG. 4 illustrates an exemplary embodiment of a man-machine interface (MMI) 82 for controller 80. Alternately, MMI 82 can comprise a graphical user interface (GUI) screen displayed on a computer screen. MMI 82 can comprise a monitor function selection device 210 that permits the selection of Gunn diode voltage monitor, Gunn diode current monitor, varactor voltage monitor, and detector voltage monitor, wherein the respective signal can be displayed in display meter 220. Alternately, monitor function selection device 210 and/ or display meter 220 can comprise a GUI. Additionally, MMI 82 can comprise a control function selection device 230 that permits the selection of at least one of a varactor voltage control, a varactor voltage sweep control, a resonance lock-on control, and a graphical user control. Alternately, control function selection device 230 can comprise a GUI.

Controller 80 and MMI 82 can be made active by toggling an ON/OFF switch 240. The ON/OFF switch 240 can power up the controller 80 and power up the power source 60 following procedures determined by the manufacturer of power source 60. For example, a 94 GHz VCO (Model GV-10), available from Farran Technology, requires that a voltage be applied to the varactor diode first, followed by the appropriate voltage applied to the Gunn diode. In another example, a 105 GHz VCO system, utilizing a 35 GHz VCO (WBV-28-20160RI) and a frequency tripler (MUT-10-16F00) available from Millitech, LLC, does not require any order to biasing the varactor diode and the Gunn diode. Controller 80 comprises software programs for both types of VCOs.

In addition, MMI 82 can comprise a plurality of status indicators. For example, MMI 82 can provide a first light emitting diode (LED) 242 to verify power to the controller 80, a second LED 244 to verify application of a bias voltage to the varactor diode, and a third LED 246 to verify application of a bias voltage to the Gunn diode. In general, power source 60 further requires setting limits on the minimum and maximum voltage to be applied to the varactor diode and the Gunn diode in order to preserve the diodes and prevent them from failure. These voltage limits can be set within controller 80. Alternately, a status indicator can comprise a GUI.

MMI 80 can further comprise a second display meter 250 that displays the varactor voltage. When control function selection device 220 is set to the varactor voltage control function, a varactor voltage set point device 260 can be used to manually adjust the voltage applied to the varactor diode, wherein the respective voltage can be displayed on display meter 250. Moreover, when the monitor function selection device 210 is set to the detector voltage monitor, the detector voltage (or cavity transmission) can be monitored while manually sweeping the varactor diode voltage. Alternately, second display meter 250 can comprise a GUI. When the control function selection device 210 is set to the resonance lock-on control, the voltage applied to the varactor diode can be adjusted using the varactor voltage set point device 260 and the amplitude of the dither voltage employed by the lock-on circuit can be set using a dither amplitude set point device 270. Varactor voltage set point device 260 and dither amplitude set point device 270 can be, for example, potentiometers. Alternately, varactor voltage set point device 260 and dither amplitude set point device 270 can comprise a GUI. When attempting to lock-on to a cavity resonance, the varactor voltage set point is adjusted to a voltage adjacent a varactor voltage corresponding to a cavity resonance (e.g. select a voltage residing somewhere between cavity resonances as shown in FIG. 3). Once the varactor voltage and the dither amplitude are set, the varactor voltage set point can be activated by, for example, toggling the lock-on set point switch 280. Activation of the varactor voltage set point sets the varactor voltage to the set point value, thus allowing the lock-on circuit to lock the output frequency of power source 60 to the selected cavity resonance. As the varactor voltage approaches the resonance envelope of a cavity resonance, the lock-on circuit can determine an error signal enabling it to lock-on to the respective cavity resonance. A successful lock to a cavity resonance can be determined by setting the monitor function selection device 210 to varactor diode voltage and monitoring this voltage in display meter 220. Once the varactor bias voltage reaches a steady value (not at the minimum or maximum voltage limits), the output frequency of power source 60 can be determined to be locked to a cavity resonance.

Figure 5:
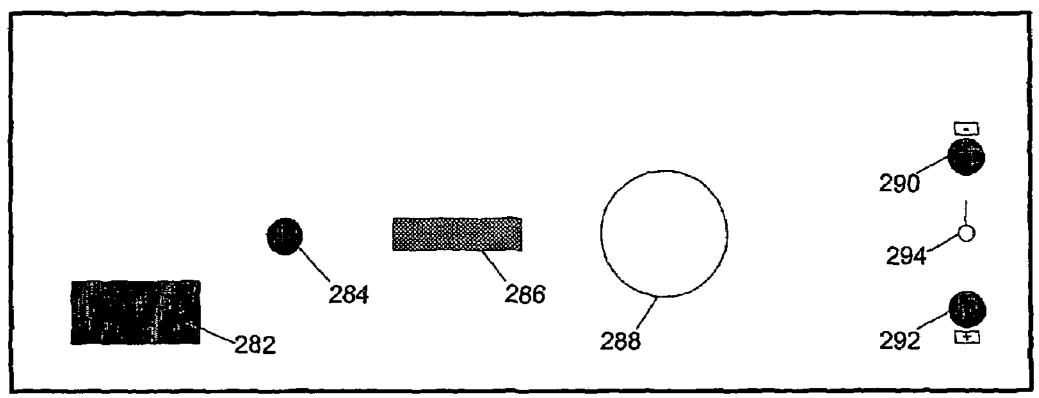
FIG. 5 shows a man-machine interface (MMI) for a diagnostic controller according to another embodiment of the present invention.

FIG. 5 illustrates an exemplary panel of controller 80. A power receptacle 282 is provided for coupling controller 80 to a (AC) power outlet using a power cable. A varactor voltage output test point 284 can be provided in order to couple the varactor voltage signal to another measurement device such as an oscilloscope or voltmeter. The varactor voltage output test point 284 can be, for example, a SMA or BNC connection. A graphical user control connection 286 can be provided to couple controller 80 to remote controller 84. The remote control connection 286 can be, for example, a 15-pin connector. A power source connection 288 is provided in order to couple controller 80 to power source 60. A pair of detector connections, 290 and 292, and a polarity toggle switch 294 can be provided to couple controller 80 to detector 70. Depending on the polarity of detector 70 (i.e. positive or negative), the appropriate detector connection 290, 292 can be selected and the polarity toggle switch can be properly set.

Figure 6:
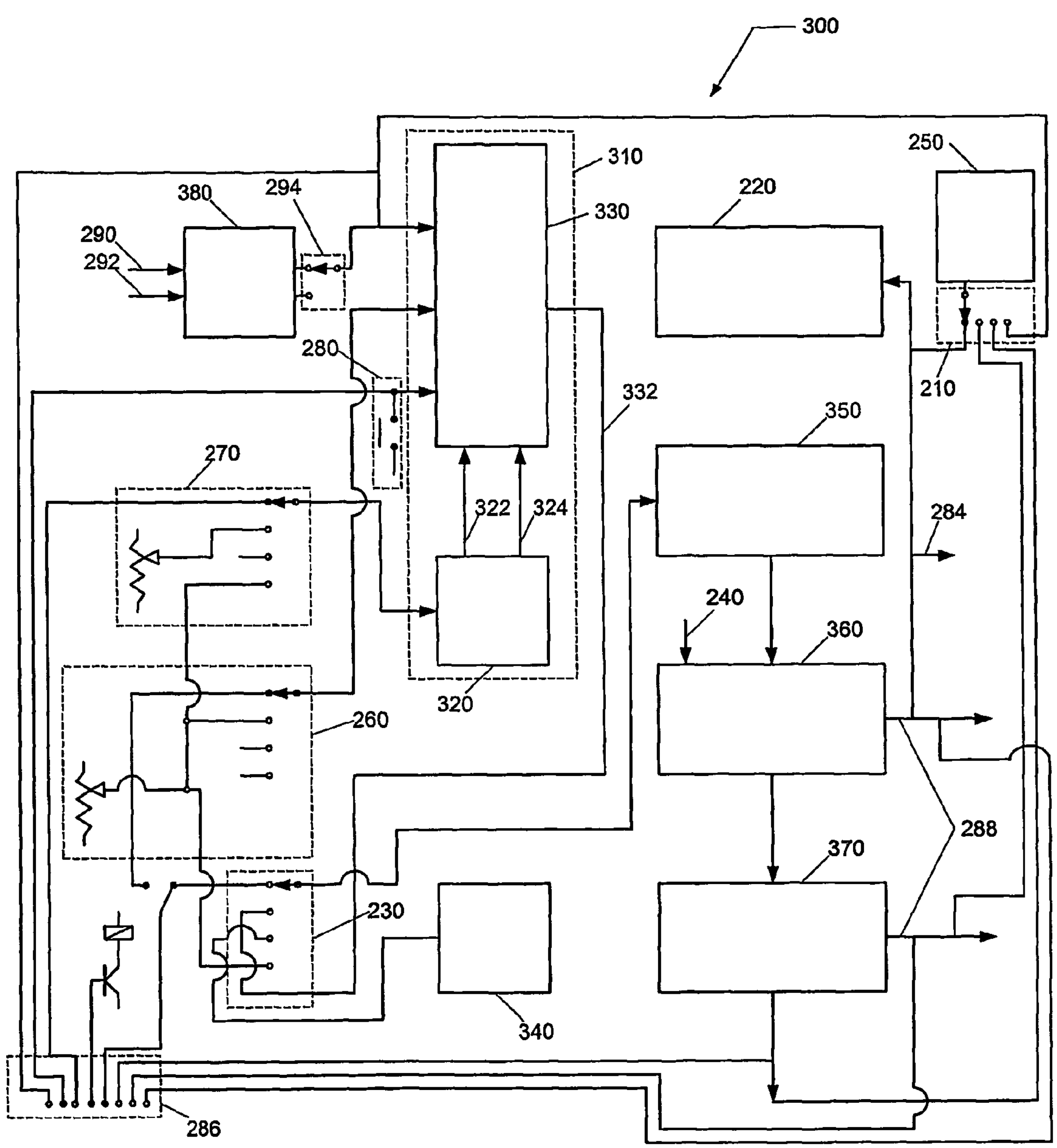
FIG. 6 presents an exemplary flow diagram of a controller according to an embodiment of the present invention.

FIG. 6 presents an exemplary flow diagram 300 for controller 80 to describe the flow logic for enabling the monitoring and controlling functions described in FIGS. 4 and 5. As described above, control function selection device 230 can permit the selection of one of the following control functions: varactor voltage control, a varactor voltage sweep control, a resonance lock-on control, and a graphical user control.

When the varactor voltage sweep control is selected, the signal coupled to isolated output 350 originates from the varactor voltage set point device 260. The isolated output 350 permits referencing the varactor voltage to a voltage other than ground potential (if necessary). For example, a 94 GHz VCO (Model GV-10), available from Farran Technology, requires that the varactor voltage be referenced to the positive node of the Gunn diode voltage. In another example, a 105 GHz VCO system, utilizing a 35 GHz VCO (WBV-28-20160RI) and a frequency tripler (MUT-10-16F00) available from Millitech, LLC, requires that the varactor voltage be referenced to ground potential. When the varactor voltage sweep function is selected, the signal coupled to isolated output 350 originates from a sweep generator 340. Sweep generator 340 can, for example, comprise a saw-tooth waveform generator.

When the resonance lock-on control function is selected, the signal input to isolated output 350 originates from the lock-on circuit 310. Lock-on circuit 310 can comprise a clock and dither circuit 320 to sample a first signal 322 from detector 70 during the positive half cycle of the square wave dither and a second signal 324 from detector 70 during the negative half cycle of the square wave dither. The first signal 322 and the second signal 324 are input to an error generator circuit 330, wherein an error signal 332 is generated and coupled to the isolated output 350.

As described earlier, the ON/OFF switch 240 can power up the controller 80 and power up the power source 60 following procedures determined by the manufacturer of power source 60. For example, a 94 GHz VCO (Model GV-10), available from Farran Technology, requires that a voltage be applied to the varactor diode first, followed by the appropriate voltage applied to the Gunn diode. In another example, a 105 GHz VCO system, utilizing a 35 GHz VCO (WBV-28-20160RI) and a frequency tripler (MUT-10-16F00) available from Millitech, LLC, does not require any order to biasing the varactor diode and the Gunn diode. In FIG. 6, a timing circuit 360 is coupled to the isolated output 350 in order to assure that, during power ON, the varactor diode is biased before the Gunn diode, and, during power OFF, the bias to the Gunn diode is removed before the bias to the varactor diode.

The output of the timing circuit 360 is coupled to the power source 60 and to a current monitor 370, wherein the Gunn current can be determined.

Additionally, FIG. 6 identifies an input circuit 380 coupled to detector 70, wherein the input circuit 380 can provide gain to the signal received from detector 70.

When the graphical user control is selected, the signal input to isolated output 350 originates from signal commands input through remote control connection 286. For example, remote controller 84 can be coupled to the remote control connection 286 in order to execute the monitoring and controlling functions provided by controll 80. Using this example, the graphical user control is now discussed in greater detail below.

Referring again to FIG. 1, remote controller 84 is coupled to controller 80, wherein remote controller 84 provides a remote MMI 86 for an operator to remotely control the diagnostic system 30 when the control function selection device 230 is set to the graphical user control.

In a preferred embodiment, the remote MMI 86 includes software that is installed onto remote controller 84. Desirably, the installation of the software on remote controller 84 causes an icon to be displayed on the remote controller's display. For example, double-clicking the icon can cause the software to begin executing to provide the remote MMI 86. Desirably, a login screen is displayed, and the login screen is used to control access to the remote MMI 86.

In a preferred embodiment, the computer 84 includes MMI software for controlling the remote MMI 86. Remote MMI 86 includes a GUI screen 400 for performing the varactor voltage sweep function and for performing the resonance lock-on function. GUI screen 400 is an easily readable status display and control interface for use with the controller 80. Visible warning signals are present on the GUI screen, and interlocks can be provided by the MMI software. In addition, remote MMI 86 includes input devices, such as a touchscreen, a mouse, and/or a keyboard.

Figure 7:
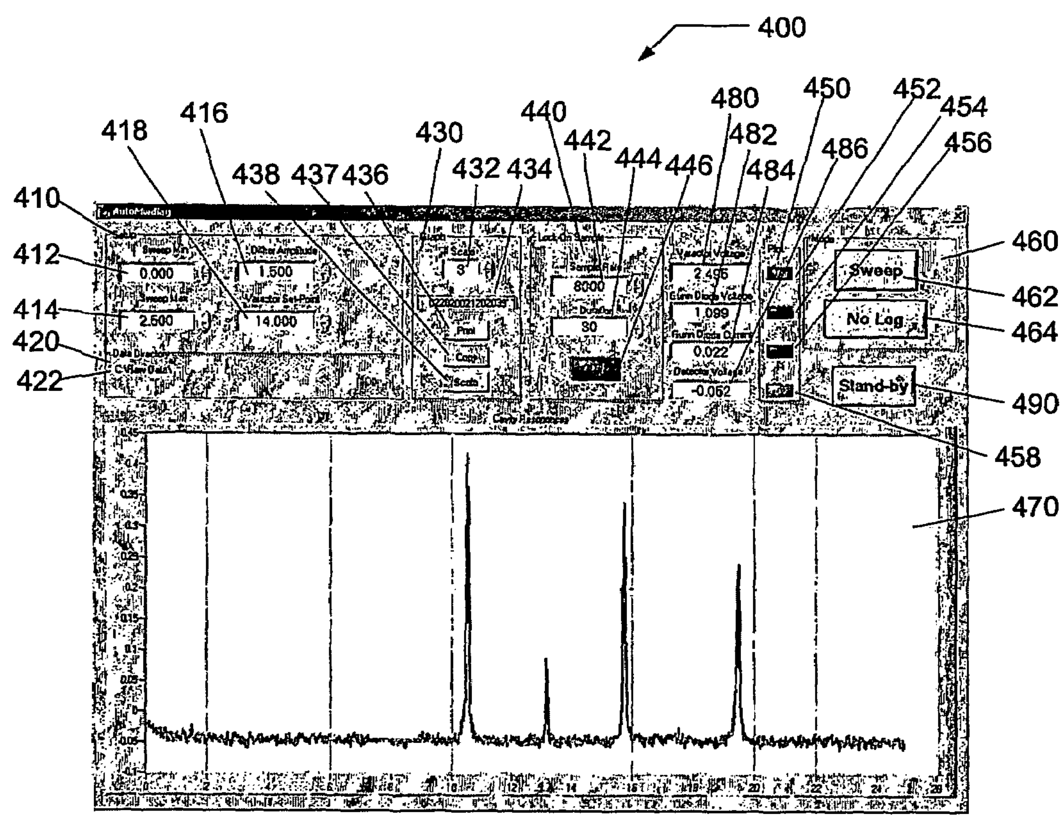
FIG. 7 shows graphical user interface (GUI) screen for a remote MMI of a remote controller according to an embodiment of the present invention.

FIG. 7 presents GUI screen 400 that enables an operator to perform the varactor voltage sweep function in order to observe the cavity resonances in multi-modal resonator 35. When using the graphical user control, the sweep function can be generated internally within remote controller 84, as indicated in FIG. 6, or internally within the controller 80. GUI screen 400 can provide a setup panel 410, a data directory panel 420, a graph panel 430, a lock-on sample panel 440, a plot panel 450, a mode panel 460, and a display panel 470.

Setup panel 410 provides a plurality of setup parameters. The plurality of setup parameters can include setting a minimum varactor diode sweep voltage 412, and a maximum varactor diode sweep voltage 414. Setup panel 410 can further provide setup parameters including setting a dither amplitude 416, and a varactor voltage set point 418.

Data directory panel 420 permits setting a directory location 422 for storing data acquired using the remote MMI 86.

Graph panel 430 permits setting a data scale factor 432 and a data file name 434, and performing a print action 436, a copy action 437, and a scale action 438. The data scale factor 432 can be employed to set the number of data points recorded during data acquisition. For example, the maximum number of data points can be 8192 when the scale factor is given an integer value of unity (1), and the number of data points acquired can be reduced by increasing the integer value of the scale factor 432, e.g. the number of points $N=8192/\{2^{(j-1)}\}$, where j represents the integer value of the scale factor 432. A default naming convention for the data file name 434 can comprise a date stamp given by "MMDDYYYYhhmmsst", where MM=Month from 01 to 12, DD=Day from 01 to 31, YYYY=Year, hh=hours from 00 to 24, mm=minutes from 00 to 60, ss=seconds from 00 to 60, and t=tenths of seconds from 0 to 9 (e.g. "032920020930101" represents 10.1 seconds past 09:30 AM on Mar. 29, 2002). Print action 436 can permit printing a plot displayed in displayed panel 470 directly to a printer, or a print-ready file such as postscript, encapsulated postscript, PDF, TIFF, JPG, BMP, etc. Copy action 437 can permit copying the plot present in display panel 470, and storing the plot in buffer memory. The stored plot can then be pasted within a document such as a WORD document, a POWERPOINT document, etc. Scale action 438 permits scaling the plot present in display panel 470 based upon the determined ordinate and abscissa ranges from the acquired data.

Plot panel 450 permits the operator to select one or more data parameters including the varactor diode voltage, the Gunn diode voltage, the Gunn diode current, and the detector voltage for plotting in display panel 470.

Mode panel 460 permits the operator to select the control function mode 462, and the data acquisition mode 464. When the varactor voltage sweep function is selected, the control function mode 462 can read "SWEEP", and when the resonance lock-on function is selected, the control function mode 462 can read "LOCK-ON". FIG. 7 presents GUI screen 400 when the control function mode 462 is set to "SWEEP". The data acquisition mode 464 can, for example, be set to "Log" in order to record acquired data to a data file defined by the data file name 434 in a file directory defined by the directory location 422, or "No Log" in order to disable recording data to a data file.

GUI screen 400 can further provide a varactor voltage display 480, a Gunn diode voltage display 482, a Gunn diode current display 484, and a detector voltage display 486 in order to, for example, permit an operator to diagnose the status of the diagnostic system 30. Displays 480, 482, 484,

486 can be updated at a pre-set frequency, hence, providing real-time data to the operator for diagnosing the status of the power source 60.

Display panel 470 can permit a presentation of data selected in plot panel 450. For example, the data presented in plot panel 450 can be selected by activating one or more of the plot variables including varactor voltage plot 452, Gunn diode voltage plot 454, Gunn diode current plot 456, and detector voltage plot 458. In FIG. 7, display panel 470 presents an exemplary cavity transmission spectrum.

GUI screen 400 can further provide an action mode 490 that permits the operator to execute the varactor diode voltage sweep and display data in the display panel 470.

Figure 8:
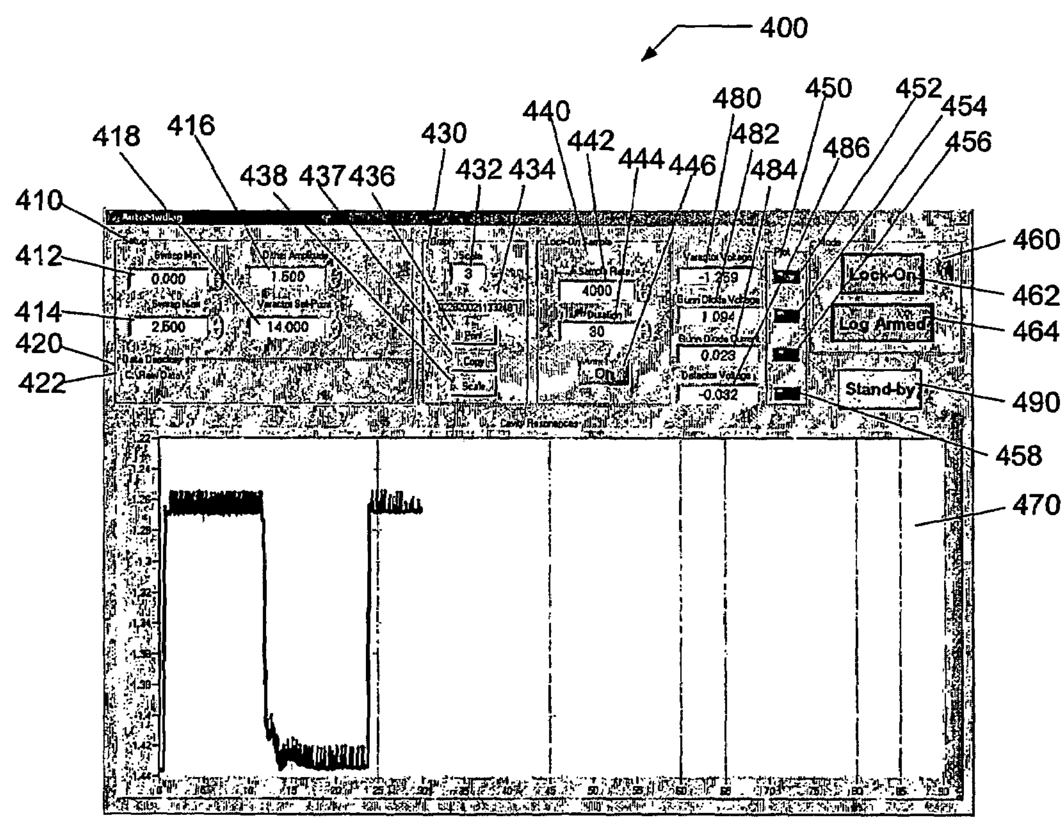
FIG. 8 shows graphical user interface (GUI) screen for a remote MMI of a remote controller according to another embodiment of the present invention.

FIG. 8 presents the GUI screen 400 when the control function mode 462 is set to "LOCK-ON". Setting the control function mode 462 to "LOCK-ON" permits the operator to perform the resonance lock-on control.

Setup panel 410 can further provide setup parameters including setting a dither amplitude 416, and a varactor voltage set point 418. Both the dither amplitude 416 and the varactor voltage set point can be set in a manner similar to that described above.

Lock-on panel 440 can permit setting one or more data acquisition parameters. The data acquisition parameters can include a sample rate 442, a sample duration 444, and a sample mode 446. The sample rate 442 can, for example, comprise the number of data points acquired per second. The sample duration 444 can, for example, comprise the time duration for the sample. The sample mode 446 can, for example, be set to "ON" in order to store acquired data to permanent memory, or be set to "OFF" in order to disable storing acquired data to permanent memory.

Display panel 470 can permit a presentation of data selected in plot panel 450. In FIG. 8, display panel 470 presents an exemplary time trace of the varactor diode voltage during a plasma "ON" condition at approximately 12 seconds and plasma "OFF" condition at approximately 24 seconds. As described in equation (2), the electron density is proportional to the shift in frequency of a cavity resonance, or during lock-on the difference between the varactor voltage with a plasma and the varactor voltage without a plasma.

Figure 9:
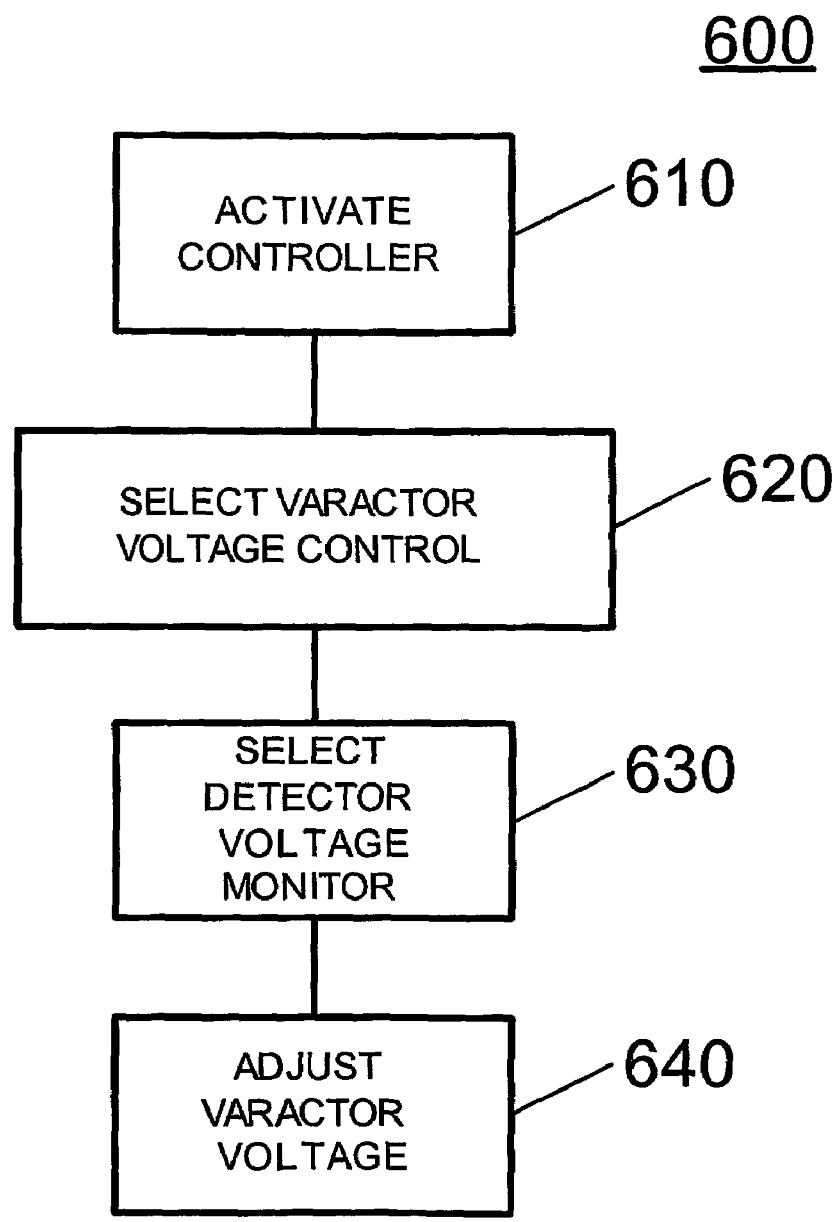
FIG. 9 presents a method of controlling a diagnostic system according to an embodiment of the present invention.

FIG. 9 presents a method controlling a diagnostic system according to an embodiment of the present invention. A flow diagram 600 begins in 610 with activating the controller for the diagnostic system. The diagnostic system can be a plasma diagnostic system and, for example, it can comprise the multi-modal resonator, the power source, the detector, and the controller described above. Activation of the controller can occur, for example, by toggling the ON/OFF switch. Alternately, activation of the controller can, for example, further include activating a remote controller.

In 620, the control function is set to the varactor voltage control. In 630, the monitor function is set to the detector voltage. In 640, the varactor voltage can be adjusted using the varactor voltage set point device. Alternately, the varactor voltage can be adjusted using a GUI coupled to the controller. Alternately, the varactor voltage can be adjusted using a GUI provided by a remote MMI coupled to the remote controller.

Figure 10:
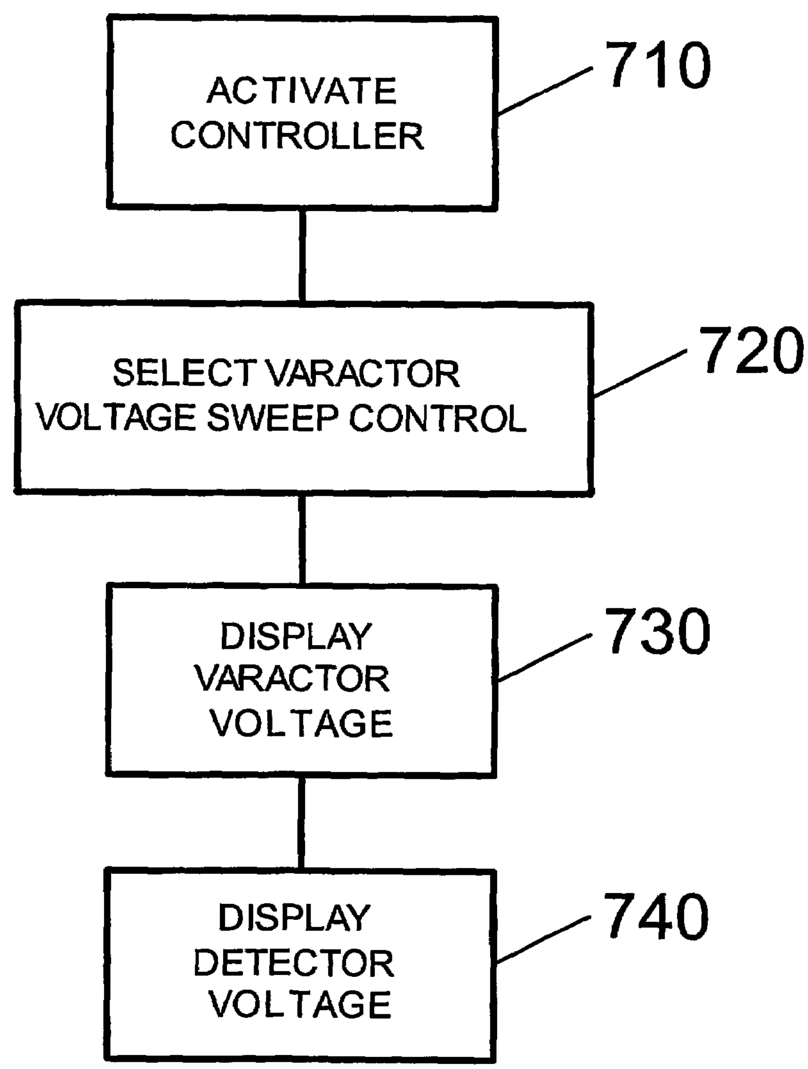
FIG. 10 presents a method of controlling a diagnostic system according to another embodiment of the present invention.

FIG. 10 presents a method of controlling a diagnostic system according to another embodiment of the present invention. A flow diagram 700 begins in 710 with activating the controller for the diagnostic system. The diagnostic system can be a plasma diagnostic system and, for example, it can comprise the multi-modal resonator, the power source, the detector, and the controller described above. Activation of the controller can occur, for example, by toggling the ON/OFF switch. Alternately, activation of the controller can, for example, further include activating a remote controller.

In 720, the control function is set to the varactor voltage sweep control. In an embodiment of the present invention, the varactor voltage sweep control enables the use of an internal sweep waveform generator in the controller using preset limits for the minimum and maximum sweep voltages set in the controller hardware. In an alternate embodiment, the minimum and maximum sweep voltages are set using a GUI. In an alternate embodiment, the minimum and maximum sweep voltages are set using a GUI provided by a remote MMI coupled to a remote controller. Alternately, the minimum and maximum sweep voltages can be default values stored in memory provided by the controller. In 730, the varactor voltage is coupled to a display. For example, the display can be provided by an internal or external oscilloscope, or a computer. The varactor voltage can, for example, be coupled from the controller to the oscilloscope using a coaxial cable connected to the varactor voltage output test point and connected to the front panel (e.g. channel no. 1) of the oscilloscope. In 740, the detector voltage is coupled to a display. Similarly, for example, the display can be provided by an internal or external oscilloscope, or a computer. The detector voltage can, for example, be coupled from the controller to the oscilloscope using a coaxial cable connected to the detector connection and connected to the front panel (e.g. channel no. 2) of the oscilloscope.

Figure 11:
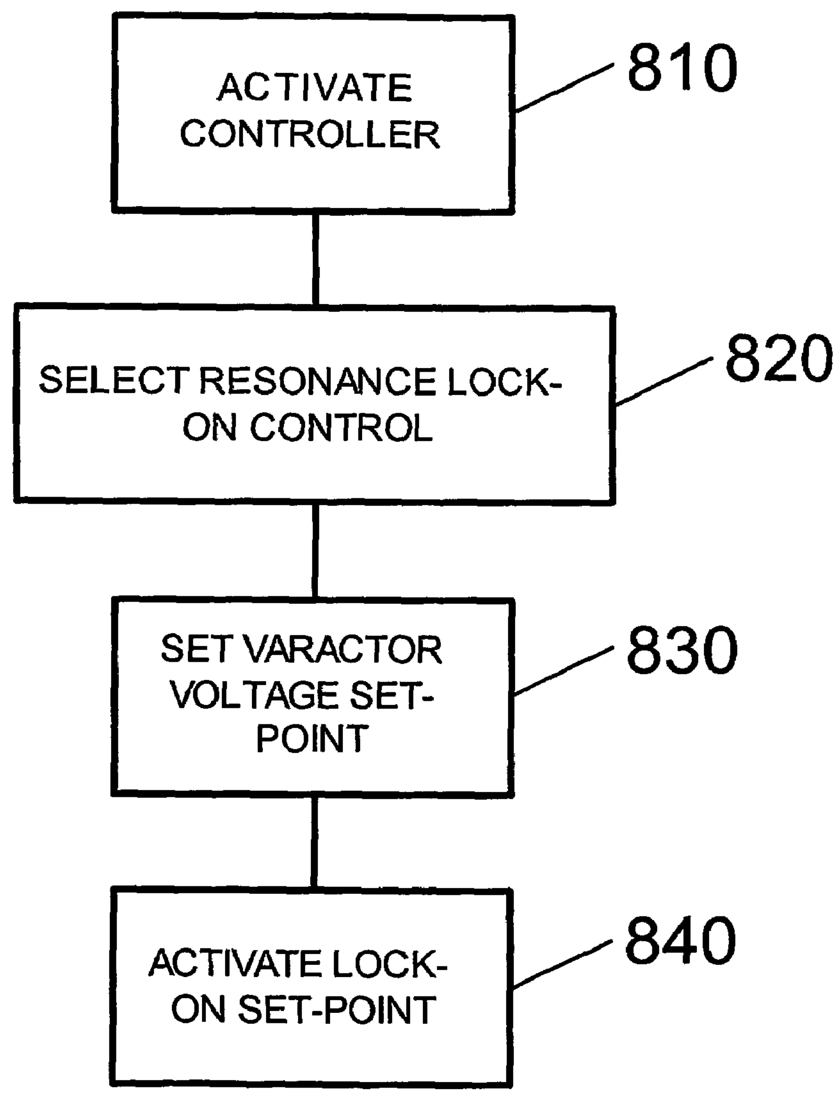
FIG. 11 presents a method of controlling a diagnostic system according to another embodiment of the present invention.

FIG. 11 presents a method of controlling a diagnostic system according to another embodiment of the present invention. A flow diagram 800 begins in 810 with activating the controller for the diagnostic system. The diagnostic system can be a plasma diagnostic system and, for example, it can comprise the multi-modal resonator, the power source, the detector, and the controller described above. Activation of the controller can occur, for example, by toggling the ON/OFF switch. Alternately, activation of the controller can, for example, further include activating a remote controller.

In 820, the control function is set to the resonance lock-on control. In an embodiment of the present invention, the resonance lock-on control enables the use of lock-on circuit provided in the controller using a preset dither amplitude and varactor voltage set point. In an alternate embodiment, the dither amplitude and the varactor voltage set point are set using a GUI. In an alternate embodiment, the dither amplitude and the varactor voltage set point are set using a GUI provided by a remote MMI coupled to a remote controller. Alternately, the dither amplitude and the varactor voltage set point can be default values stored in memory provided by the controller. In 830, the varactor voltage set-point is set. Typically, the varactor voltage set-point is set to a value adjacent a selected cavity resonance. In 840, the lock-on set-point switch is toggled to apply the varactor voltage set-point voltage to the varactor diode. Thereafter, the varactor voltage drifts until lock-on is achieved. Once lock-on is achieved, the diagnostic system can be used to monitor, for example, the electron density in the multi-modal resonator.

Figure 12:
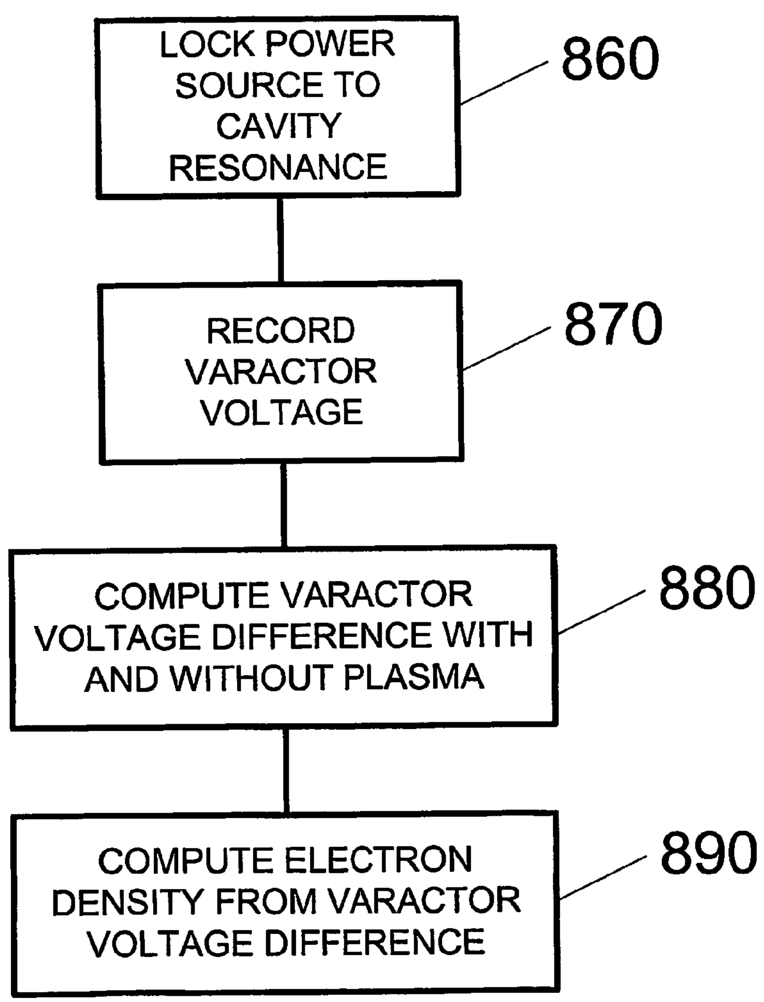
FIG. 12 presents a method of controlling a diagnostic system according to another embodiment of the present invention.

FIG. 12 presents a method of computing an electron density in a multi-modal resonator according to another embodiment of the present invention. A flow diagram 850 begins in 860 with locking the power source to a cavity resonance using, for example, the method described in FIG. 11. In 870, the varactor voltage is recorded via a data acquisition system such as an oscilloscope, an A/D converter, a computer, an operator, etc. In 880, a varactor voltage difference is determined by computing the difference between the varactor voltage observed without plasma in the multi-modal resonator and the varactor voltage observed with plasma in the multi-modal resonator. In 890, an electron density is computed from the varactor voltage difference using the varactor voltage-frequency calibration of the power source and equation (2). The varactor voltage can be recorded and stored in temporary memory, wherein the varactor voltage difference and electron density are computed, and the electron density is displayed and/or stored to permanent memory. In an alternate embodiment, the varactor voltage is recorded and stored in permanent memory, wherein the varactor voltage difference and electron density are computed either during processing or during post-processing, and the electron density is displayed and/or stored to permanent memory.

Figure 13:
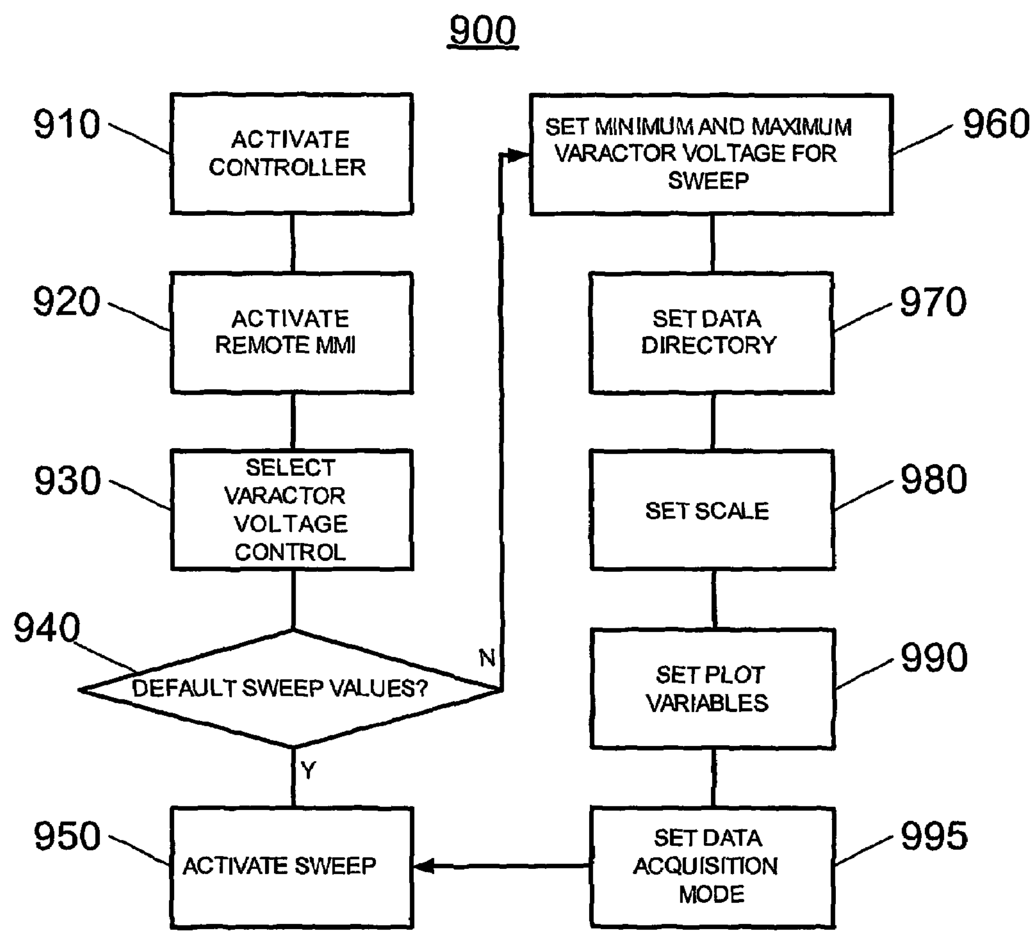
FIG. 13 presents a method of controlling a diagnostic system according to another embodiment of the present invention.

FIG. 13 presents a method of controlling a diagnostic system according to another embodiment of the present invention. A flow diagram 900 begins in 910 with activating the controller for the diagnostic system. The diagnostic system can be a plasma diagnostic system and, for example, it can comprise the multi-modal resonator, the power source, the detector, and the controller described above. Activation of the controller can occur, for example, by toggling the ON/OFF switch.

In 920, the remote MMI is activated. Activation of the remote MMI can, for example, comprise turning on the remote controller hosting the MMI software, and executing the MMI software to initiate the GUI screen for the remote MMI. In 930, the control function mode is set to sweep mode by activating the control function mode. For example, the control function mode can be set in the mode panel of the GUI screen to read “SWEEP” using, for example, keyboard entry, mouse entry, etc. In general, the varactor voltage sweep function of the remote MMI can be set as the default configuration.

In 940, the default settings for the varactor voltage sweep function can be checked. If the settings are acceptable, then the varactor voltage sweep can be activated by toggling the remote MMI action mode. As the varactor voltage sweep function is performed, the plot of the default plot variables is presented in the display panel of the GUI screen. If changes are necessary, then the settings can be adjusted in 960 through 995. In 960, the minimum and maximum varactor voltages for the sweep can be varied in the setup panel of the GUI screen using, for example, keyboard entry, mouse entry, etc. In 970, the data directory for storing acquired data can be varied in the data directory panel of the GUI screen using, for example, keyboard entry, mouse entry, etc. In 980, the plot scale factor (i.e. number of data points in varactor voltage sweep) can be varied in the graph panel of the GUI screen using, for example, keyboard entry, mouse entry, etc. In 990, the plot variables (i.e. varactor diode voltage, Gunn diode voltage, Gunn diode current, or detector voltage) can be selected in the plot panel of the GUI screen using, for example, keyboard entry, mouse entry, etc. In 995, the data acquisition mode (i.e. enable recording data acquisition to permanent memory or disable recording data acquisition to permanent memory) can be set in the mode panel of the GUI screen using, for example, keyboard entry, mouse entry, etc.

Following adjustments to the settings, the varactor voltage sweep function is performed and the plot of the selected plot variables is presented in the display panel of the GUI screen in 950.

Figure 14:
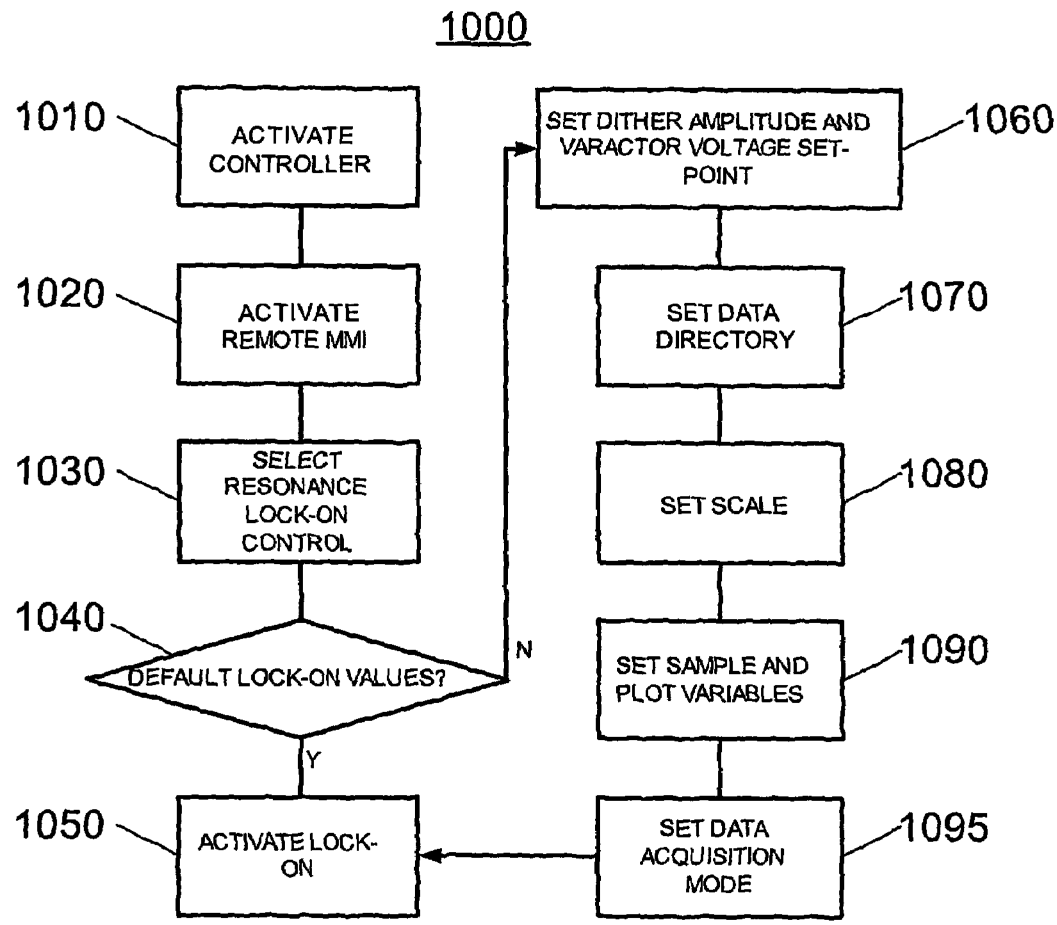
FIG. 14 presents a method of controlling a diagnostic system according to another embodiment of the present invention.

FIG. 14 presents a method of controlling a diagnostic system according to another embodiment of the present invention. A flow diagram 1000 begins in 1010 with activating the controller for the diagnostic system. The diagnostic system can be a plasma diagnostic system and, for example, it can comprise the multi-modal resonator, the power source, the detector, and the controller described above. Activation of the controller can occur, for example, by toggling the ON/OFF switch.

In 1020, the remote MMI is activated. Activation of the remote MMI can, for example, comprise turning on the remote controller hosting the MMI software, and executing the MMI software to initiate the GUI screen for the remote MMI. In 1030, the control function mode is set to lock-on mode by activating the control function mode. For example, the control function mode can be set in the mode panel of the GUI screen to read “LOCK-ON” using, for example, keyboard entry, mouse entry, etc. In general, the resonance lock-on function of the remote MMI can be set as the default configuration.

In 1040, the default settings for the resonance lock-on function can be checked. If the settings are acceptable, then the resonance lock-on function can be activated by toggling the remote MMI action mode. As the resonance lock-on is performed, the plot of the default plot variables is presented in the display panel of the GUI screen. If changes are necessary, then the settings can be adjusted in 1060 through 1095. In 1060, the dither amplitude and/or the varactor voltage set-point can be varied in the setup panel of the GUI screen using, for example, keyboard entry, mouse entry, etc. In 1070, the data directory for storing acquired data can be varied in the data directory panel of the GUI screen using, for example, keyboard entry, mouse entry, etc. In 1080, the plot scale factor (i.e. number of data points in varactor voltage sweep) can be varied in the graph panel of the GUI screen using, for example, keyboard entry, mouse entry, etc. In 1090, the sample and plot variables (i.e. sample rate and/or sample duration, and varactor diode voltage, Gunn diode voltage, Gunn diode current, or detector voltage) can be selected in the graph and plot panels of the GUI screen using, for example, keyboard entry, mouse entry, etc. In 1095, the data acquisition mode (i.e. enable recording data acquisition to permanent memory or disable recording data acquisition to permanent memory) can be set in the sample and/or mode panels of the GUI screen using, for example, keyboard entry, mouse entry, etc.

Following adjustments to the settings, the resonance lock-on function is performed and the plot of the selected plot variables is presented in the display panel of the GUI screen in 1050.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A diagnostic system for plasma processing, said diagnostic system comprising:

a multi-modal resonator;

a power source, including a Gunn diode voltage controlled oscillator (VCO), coupled to said multi-modal resonator;

a detector coupled to said multi-modal resonator;

a controller coupled to said power source and said detector, wherein said controller provides at least one monitoring function and at least one controlling function, said at least one monitoring function including at least one of a Gunn diode voltage monitor, a Gunn diode current monitor, a varactor voltage monitor, an electron density monitor, and a detector voltage monitor, and said at least one controlling function including at least one of a varactor voltage control, a varactor voltage sweep control, a resonance lock-on control, and a graphical user control; and a programmable user interface connected to said controller, said programmable user interface selecting said at least one monitoring function and said at least one controlling function in the diagnostic system.

2. The diagnostic system as recited in claim 1, wherein said user interface includes a man-machine interface (MMI) for performing said at least one function.

3. The diagnostic system as recited in claim 2, wherein said MMI displays at least one of a Gunn diode voltage, a Gunn diode current, a varactor voltage, and a detector voltage.

4. The diagnostic system as recited in claim 2, wherein said varactor voltage control function provides the capability for varying the varactor voltage on said Gunn diode VCO using said MMI.

5. The diagnostic system as recited in claim 2, wherein said varactor voltage sweep function provides the capability for automatically varying the varactor voltage on said Gunn diode VCO using said MMI.

6. The diagnostic system as recited in claim 5, wherein said automatically varying the varactor voltage on said Gunn diode VCO comprises activating a sweep generator packaged in said controller using said MMI.

7. The diagnostic system as recited in claim 2, wherein said resonance lock-on function comprises activating a lock-on circuit packaged in said controller, setting a varactor voltage set-point, and activating said varactor voltage set-point.

8. The diagnostic system as recited in claim 1, wherein said controller is further coupled to a remote controller, and said controller permits remote control of said controller using said remote controller.

9. The diagnostic system as recited in claim 8, wherein said remote controller provides a remote man-machine interface (MMI) for remotely performing said at least one function provided by said controller.

10. The diagnostic system as recited in claim 9, wherein said remote man-machine interface comprises a graphical user interface (GUI).

11. The diagnostic system as recited in claim 9, wherein said man-machine interface comprises executing software on said remote controller.

12. The diagnostic system as recited in claim 10, wherein said graphical user interface provides a setup panel for presenting a plurality of setup parameters.

13. The diagnostic system as recited in claim 12, wherein said plurality of setup parameters comprises at least one of a minimum varactor diode sweep voltage, a maximum varactor diode sweep voltage, a dither amplitude, and a varactor voltage set point.

14. The diagnostic system as recited in claim 10, wherein said graphical user interface provides a data directory panel, said data directory panel permits setting a directory location for storing data acquired using said remote man-machine interface.

15. The diagnostic system as recited in claim 10, wherein said graphical user interface provides a graph panel, said graph panel permits at least one of setting a data scale factor, setting a data file name, performing a print action, performing a copy action, and performing a scale action.

16. The diagnostic system as recited in claim 10, wherein said graphical user interface provides a display panel for presenting at least one data parameter.

17. The diagnostic system as recited in claim 16, wherein said data parameter includes a Gunn diode voltage, a Gunn diode current, a varactor diode voltage, and a detector voltage.

18. The diagnostic system as recited in claim 16, wherein said graphical user interface further provides a plot panel for selecting said at least one data parameter.

19. The diagnostic system as recited in claim 10, wherein said graphical user interface provides a mode panel for selecting at least one of a control function mode and a data acquisition mode.

20. The diagnostic system as recited in claim 19, wherein said control function modes comprises at least one of a varactor voltage sweep function and a resonance lock-on function.

21. The diagnostic system as recited in claim 19, wherein said data acquisition mode comprises at least one of enabling data storage to a data file and disabling data storage to a data file.

22. The diagnostic system as recited in claim 19, wherein said graphical user interface provides an action mode, said action mode permits an operator to execute said control function mode.

23. The diagnostic system as recited in claim 19, wherein said graphical user interface provides a lock-on panel for setting at least one data acquisition parameter.

24. The diagnostic system as recited in claim 23, wherein said data acquisition parameters include a sample rate, a sample duration, and a sample mode.

25. The diagnostic system as recited in claim 1, wherein said controller further provides a graphical user interface (GUI) for performing said at least one function.

26. A method of controlling a diagnostic system, said diagnostic system comprising a multi-modal resonator to produce a cavity resonance, a power source to produce an output frequency, a detector to produce a transmission signal, a controller coupled to said power source and said detector, and a user interface connected to said controller and programmable to select at least one monitoring function and at least one controlling function, said method comprising:

activating said controller;

selecting from said user interface a varactor voltage control in order to control a varactor voltage of said power source;

selecting from said user interface a detector voltage monitor in order to monitor said transmission signal from said detector; and adjusting said varactor voltage for said power source using said controller.

27. The method as recited in claim 26, wherein said user interface comprises a man-machine interface for performing at least one of setting said control function, setting said monitor function, and adjusting said varactor voltage.

28. The method as recited in claim 26, wherein said controller provides a graphical user interface for performing at least one of setting said control function, setting said monitor function, and adjusting said varactor voltage.

29. A method of controlling a diagnostic system, said diagnostic system comprising a multi-modal resonator to produce a cavity resonance, a power source to produce an output frequency, a detector to produce a transmission signal, a controller coupled to said power source and said detector, and a user interface connected to said controller and programmable to select at least one monitoring function and at least one controlling function, said method comprising:

activating said controller;

selecting from said user interface a varactor voltage sweep control in order to automatically control a varactor voltage of said power source;

coupling said varactor voltage to a display; and coupling said transmission signal from said detector to said display.

30. The method as recited in claim 29, wherein said display comprises at least one of a computer, a digital signal processor, and an oscilloscope.

31. The method as recited in claim 29, wherein said user interface comprises a man-machine interface for performing said setting said control function.

32. The method as recited in claim 29, wherein said controller provides a graphical user interface for performing said setting said control function.

33. A method of controlling a diagnostic system, said diagnostic system comprising a multi-modal resonator to produce a cavity resonance, a power source to produce an output frequency, a detector to produce a transmission signal, a controller coupled to said power source and said detector and configured to provide a lock-on circuit for receiving said transmission signal from said detector and locking said output frequency of said power source to said cavity resonance of said multi-modal resonator, and a user interface connected to said controller and programmable to select at least one monitoring function and at least one controlling function, said method comprising:

activating said controller;

selecting from said user interface a resonance lock-on function;

selecting from said user interface a varactor voltage of said power source; and locking said output frequency of said power source to said cavity resonance of said multi-modal resonator by activating a varactor voltage set-point using said controller.

34. The method as recited in claim 33, wherein said method further comprises the step of:

measuring an electron density in said multi-modal resonator, wherein said measuring said electron density comprises the steps of:

recording said varactor voltage corresponding to said locking said output frequency of said power source to said cavity resonance of said multi-modal resonator;

determining a difference between said varactor voltage with plasma in said multi-modal resonator and said varactor voltage without plasma in said multi-modal resonator; and computing said electron density from said difference.

35. The method as recited in claim 33, wherein said user interface comprises a man-machine interface for setting said control function, setting said varactor voltage set-point, and activating said varactor voltage set-point.

36. The method as recited in claim 33, wherein said controller provides a graphical user interface for setting said control function, setting said varactor voltage set-point, and activating said varactor voltage set-point.

37. A method of controlling a diagnostic system, said diagnostic system comprising a multi-modal resonator to produce a cavity resonance, a power source to produce an output frequency, a detector to produce a transmission signal, a controller coupled to said power source and said detector, a remote controller coupled to said controller, and a user interface connected to said remote controller and programmable to select at least one monitoring function and at least one controlling function, said method comprising:

activating said controller;

activating said user interface;

selecting from said user interface a varactor voltage sweep control; and activating said varactor voltage sweep control using default settings.

38. The method as recited in claim 37, wherein said method further comprises modifying said default settings prior to activating said varactor voltage sweep function.

39. The method as recited in claim 38, wherein said modifying said default settings comprises modifying at least one of a minimum varactor diode voltage, a maximum varactor diode voltage, a data directory for storing acquired data, a scale, a plot variable, and a data acquisition mode.

40. A method of controlling a diagnostic system, said diagnostic system comprising a multi-modal resonator to produce a cavity resonance, a power source to produce an output frequency, a detector to produce a transmission signal, a controller coupled to said power source and said detector and configured to provide a lock-on circuit for receiving said transmission signal from said detector and locking said output frequency of said power source to said cavity resonance of said multi-modal resonator, a remote controller coupled to said controller, and a user interface connected to said remote controller and programmable to select at least one monitoring function and at least one controlling function, said method comprising:

activating said controller;

activating said rface;

selecting from said user interface a resonance lock-on control; and activating said resonance lock-on control using default settings.

41. The method as recited in claim 40, wherein said method further comprises modifying said default settings prior to activating said resonance lock-on control.

42. The method as recited in claim 41, wherein said modifying said default settings comprises modifying at least one of a dither amplitude, a varactor voltage set-point, a data directory for storing acquired data, a scale, a plot variable, a sample rate, a sample duration, and a data acquisition mode.

* * * * *